United States Patent
Chen et al.

(10) Patent No.: US 9,876,003 B2
(45) Date of Patent: Jan. 23, 2018

(54) ELECTROSTATIC DISCHARGE PROTECTION CIRCUIT AND CONFIGURATION METHOD

(71) Applicant: Semiconductor Manufacturing International (Shanghai) Corporation, Shanghai (CN)

(72) Inventors: Yan Chen, Shanghai (CN); Zhenjiang Su, Shanghai (CN); Wei Lei, Shanghai (CN); Jie Chen, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 382 days.

(21) Appl. No.: 14/663,569

(22) Filed: Mar. 20, 2015

(65) Prior Publication Data

US 2015/0288173 A1 Oct. 8, 2015

(30) Foreign Application Priority Data

Apr. 2, 2014 (CN) .......................... 2014 1 0131248

(51) Int. Cl.
  *H02H 9/04* (2006.01)
  *H01L 27/02* (2006.01)
(52) U.S. Cl.
  CPC ...... *H01L 27/0248* (2013.01); *H01L 27/0285* (2013.01); *H02H 9/046* (2013.01)
(58) Field of Classification Search
  CPC .. H01L 27/0248; H01L 27/0285; H02H 9/046
  USPC .......................................................... 361/56
  See application file for complete search history.

(56) References Cited

U.S. PATENT DOCUMENTS

| 7,529,070 | B2* | 5/2009 | Bhattacharya | H01L 27/0266 361/111 |
| 2007/0103825 | A1* | 5/2007 | Ker | H01L 27/0266 361/56 |
| 2009/0089719 | A1* | 4/2009 | Gauthier, Jr. | G06F 17/5045 716/100 |
| 2010/0148797 | A1* | 6/2010 | Ker | H02H 9/046 324/555 |
| 2013/0050885 | A1* | 2/2013 | Chen | H02H 9/046 361/56 |

* cited by examiner

*Primary Examiner* — Thienvu Tran
*Assistant Examiner* — Kevin J Comber
(74) *Attorney, Agent, or Firm* — Anova Law Group, PLLC

(57) ABSTRACT

The present disclosure provides an electrostatic discharge (ESD) protection circuit and configuration method thereof. The ESD protection circuit includes first and second power supply terminals, first and second detection units, a control unit, a clamping unit, and a voltage-dividing output node defined between the first and second power supply terminals. The first detection unit detects an electrostatic signal, based on a signal between the first power supply terminal and the voltage-dividing output node, and outputs a first signal. Likewise, the second detection unit outputs a second signal. The control unit is configured to be driven by the first signal to convert into a first discharge control signal and by the second signal to convert into a second discharge control signal. The clamping unit is configured to receive the first and second discharge control signals to discharge an electrostatic current between the first and the second power supply terminals.

18 Claims, 3 Drawing Sheets

ELECTROSTATIC DISCHARGE PROTECTION CIRCUIT AND CONFIGURATION METHOD

CROSS-REFERENCES TO RELATED APPLICATIONS

This application claims the priority of Chinese patent application No. CN201410131248.1, filed on Apr. 2, 2014, the entire content of which is incorporated herein by reference.

FIELD OF THE DISCLOSURE

The present disclosure relates to the field of integrated circuit (IC) technology and, more particularly, relates to an electrostatic discharge protection circuit.

BACKGROUND

As the feature sizes of the integrated circuit technology continue to shrink, the electrostatic discharge protection ability of the integrated circuit chips has become a key factor to ensure the reliable operation of the internal circuitry. In an electrostatic discharge phenomenon, transfer of electrostatic charges instantly occurs between two objects with different electric potentials, when such two objects are approaching to each other and/or contacting with each other.

In advanced integrated circuit technology, the gate oxide layer of semiconductor device is very thin. The equivalent capacitance of the gate oxide layer is very small. The electrostatic charge accumulated on the gate oxide layer forms a very large equivalent gate voltage, which will cause device and/or circuit to fail.

The electrostatic shock for integrated circuit chips has different modes, which require different protection circuits. When the electrostatic shock occurs between a power supply pin and a ground pin or between input/output pins, the electrostatic discharge current will flow through the internal functional circuit blocks and cause damages to the internal circuitry. Power supply clamping ESD (electrostatic discharge) protection circuit is an effective remedy against both electrostatic shock modes described above. When a chip is subject to an electrostatic shock, the ESD protection circuit provides an effective shunt circuit to discharge the electrostatic charges and to prevent functional circuits within the chip from any electrostatic shock damages.

FIG. 1 illustrates a conventional ESD protection circuit 1, including a first power supply terminal 10, a second power supply terminal 11, an electrostatic detection unit 12, a logic control unit 13 and a clamping transistor 14. The first power supply terminal 10 connects with the power supply voltage. The second power supply terminal 11 connects with the ground. The electrostatic detection unit 12 includes a resistor 120 and a capacitor 121 connected in series between the first power supply terminal 10 and the second power supply terminal 11. The logic control unit 13 is an inverter.

The ESD protection circuit 1 operates as follows. When an ESD pulse is applied to the first power supply terminal 10, the voltage at the terminal 15 between the resistor 120 and the capacitor 121 is pulled down to the voltage level (ground) of the second power supply terminal 11. After being inverted by the logic control unit 13, the gate voltage of the clamping transistor 14 is pulled up to a high voltage level which turns on the clamping transistor 14 to discharge the electrostatic charge accumulated by the ESD shock. After a time period of the RC time constant for coupling the resistor 120 and the capacitor 121 passes, the voltage at the terminal 15 changes to the voltage level (which is the high voltage level) of the first power supply terminal 10. After being inverted by the logic control unit 13, the gate voltage of the clamping transistor 14 is pulled down to a low voltage level which turns off the clamping transistor 14. The ESD protection operation is then concluded.

When the power on charging voltage is applied to the first power supply terminal 10, the voltage at the terminal 15 remains at the voltage level of the first power supply terminal 10. After being inverted by the logic control unit 13, the gate voltage of the clamping transistor 14 remains at a low voltage level, which ensures the clamping transistor 14 to be turned off in the power on process.

However, the conventional ESD protection circuit has the following limitations. The voltage handling capability of the components in the ESD protection circuit is limited and makes them unable to operate under high voltage condition. The ESD protection circuit has limited voltage handling capability and cannot withstand the high voltage sources of the chip internal circuitry.

BRIEF SUMMARY OF THE DISCLOSURE

One aspect of the present disclosure provides an electrostatic discharge (ESD) protection circuit. The ESD protection circuit includes a first power supply terminal, a second power supply terminal, a first detection unit, a second detection unit, a control unit, a clamping unit, and a voltage-dividing output node defined between the first and the second power supply terminals. The first detection unit is configured to detect an electrostatic signal, based on a signal between the first power supply terminal and the voltage-dividing output node, and to output a first signal when the electrostatic signal is sensed. The second detection unit is configured to detect an electrostatic signal, based on a signal between the second power supply terminal and the voltage-dividing output node, and to output a second signal when the electrostatic signal is sensed. The control unit is configured to be driven by the first signal to convert the first signal into a first discharge control signal and by the second signal to convert the second signal into a second discharge control signal. The clamping unit is configured to receive the first discharge control signal and the second discharge control signal to discharge an electrostatic current between the first and the second power supply terminals.

Another aspect of the present disclosure provides a method for configuring an electrostatic discharge (ESD) protection circuit: by providing a first power supply terminal, a second power supply terminal, a first detection unit, a second detection unit, a control unit, and a clamping unit suitable for a circuit. A voltage-dividing output node is defined between the first and the second power supply terminals. The first detection unit is configured to detect an electrostatic signal, based on a signal between the first power supply terminal and the voltage-dividing output node, and to output a first signal when the electrostatic signal is sensed. The second detection unit is configured to detect an electrostatic signal, based on a signal between the second power supply terminal and the voltage-dividing output node, and to output a second signal when the electrostatic signal is sensed. The control unit is configured to be driven by the first signal to convert the first signal into a first discharge control signal and by the second signal to convert the second signal into a second discharge control signal. The clamping unit is configured to receive the first discharge control signal and the second discharge control signal to discharge an electrostatic current between the first and the second power supply terminals.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

Figure 1:
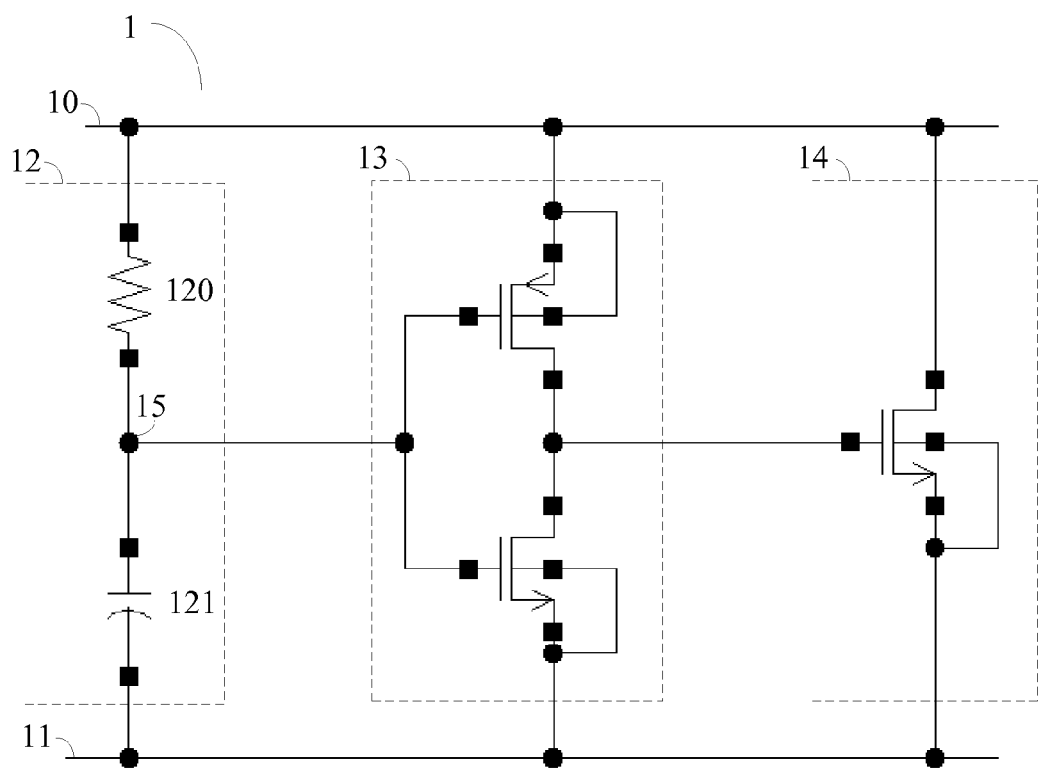
FIG. 1 illustrates a schematic diagram of a conventional electrostatic discharge protection circuit.
Figure 2:
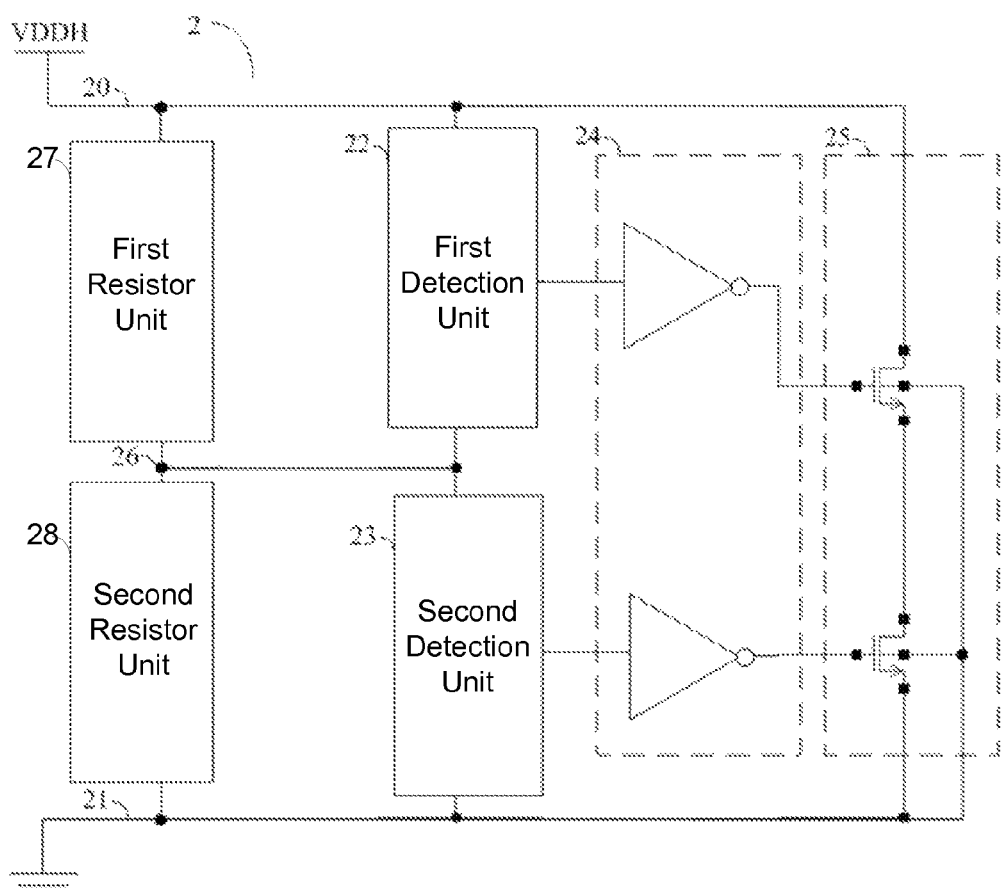
FIG. 2 illustrates a schematic diagram of an exemplary electrostatic discharge protection circuit consistent with various disclosed embodiments.

FIG. 2 illustrates a schematic diagram of an exemplary electrostatic discharge protection circuit consistent with various disclosed embodiments. As shown in FIG. 2, an exemplary electrostatic discharge protection circuit 2 includes a first power supply terminal 20, a second power supply terminal 21, a first detection unit 22, a second detection unit 23, a control unit 24 and a clamping unit 25. A voltage-dividing output node 26 is defined between the first power supply terminal 20 and the second power supply terminal 21.

Unlike the electrostatic detection terminal in the conventional ESD protection circuit, when the electrostatic discharge is not detected, the voltage-dividing output node 26 may have the same voltage level as the power supply voltage, i.e., the voltage level of the first power supply terminal. In the present disclosure, the voltage divider not only divides the power supply voltage, but also divides the electrostatic discharge voltage.

Referring back to FIG. 2, the electrostatic discharge protection circuit 2 further includes a first resistor unit 27 and a second resistor unit 28. The first resistor unit 27 is located between the first power supply terminal 20 and the voltage-dividing output node 26. The second resistor unit 28 is located between the second power supply terminal 21 and the voltage-dividing output node 26.

The voltage dividing ratio at the voltage-dividing output node 26 may be determined by the equivalent resistances of the first resistor unit 27 and the second resistor unit 28.

Although two resistors are shown in FIG. 2 for illustration purposes, in various embodiments, any number (less or more than two) of such resistor units may be encompassed in the present disclosure. For example, there may be any number of resistor units configured between the first power supply terminal 20 and the voltage-dividing output node 26. Likewise, there may be any number of resistor units configured between the second power supply terminal 21 and the voltage-dividing output node 26. Depending on the function of the circuit, each resistor unit may be any other suitable, functional device/component that has an equivalent resistor function.

In one embodiment, at least one resistor unit may be configured between the first power supply terminal 20 and the voltage-dividing output node 26, and also at least one resistor unit may be configured between the second power supply terminal 21 and the voltage-dividing output node 26.

As configured in the electrostatic discharge protection circuit 2, the first resistor unit 27 and the second resistor unit 28 may have the same resistance. The first power supply terminal 20 may connect with the power supply voltage VDDH, and the second power supply terminal 21 may connect with the ground. Thus, the divided voltage VDD at the voltage-dividing output node 26 is one half ($\frac{1}{2}$) of the power supply voltage (i.e., VDD is one half of VDDH), or VDDH=2*VDD.

The voltage-dividing output node 26 may sense the electrostatic signal between the first power supply terminal 20 and the second power supply terminal 21. Further, the voltage-dividing output node 26 may act as a third power supply terminal dividing the voltage between the first power supply terminal 20 and the second power supply terminal 21. When an electrostatic discharge voltage is present between the first power supply terminal 20 and the second power supply terminal 21, there may be a path of sub-electrostatic discharge voltage between the first power supply terminal 20 and the voltage-dividing output node 26, and another path of sub-electrostatic discharge voltage between the second power supply terminal 21 and the voltage-dividing output node 26. The voltage-dividing output node 26 may thus be used to divide the electrostatic discharge voltage between the first power supply terminal 20 and the second power supply voltage 21. Thus, the voltage-dividing output node 26 may be used to sense the electrostatic signal.

When the voltage-dividing output node 26 senses an electrostatic signal, the first detection unit 22 may be used to output a first signal, and the second detection unit 23 may be used to output a second signal. In the present disclosure, both the first detection unit 22 and the second detection unit 23 are used to sense and detect the electrostatic signal at the voltage-dividing output node 26, such that the voltage difference between both ends of each detection unit is reduced. For example, referring back to FIG. 2, under the normal power supply voltage, the voltage between both ends of the first detection unit 22 is only one half ($\frac{1}{2}$) the power supply voltage, i.e., is the voltage difference between the first power supply terminal 20 and the voltage-dividing output node 26. Under the normal power supply voltage, the voltage between both ends of the second detection unit 23 is only one half ($\frac{1}{2}$) the power supply voltage, i.e., is the voltage difference between the second power supply terminal 21 and the voltage-dividing output node 26.

Still in FIG. 2, the control unit 24 may be driven by the first signal and convert the first signal into a first discharge control signal. The control unit 24 may also be driven by the second signal and convert the second signal into a second discharge control signal. In the present disclosure, the control unit 24 may be driven to output the first discharge control signal and the second discharge control signal only after receiving both the first signal and the second signal.

The control unit 24 may be considered as a pre-driver buffer stage unit or a logical driver stage unit. The primary function of the control unit 24 may be to provide a buffer delay to the first signal and then, to produce/output the first discharge control signal, and to provide a buffer delay to the second signal and then to produce/output the second discharge control signal.

The control unit 24 may include two sets of inverters. The first set of the inverters may be used to receive the first signal and produce/output the first discharge control signal. The second set of the inverters may be used to receive the second signal and produce/output the second discharge control signal. The first set of the inverters may include at least one inverter. The second set of the inverters may include at least one inverter.

The clamping unit 25 may be used to receive the first discharge control signal and the second discharge control signal to discharge the electrostatic current between the first power supply terminal 20 and the second power supply terminal 21. Specifically, the clamping unit 25 may include at least one clamping transistor. Considering the voltage handling capacity of clamping transistors, the clamping unit 25 may include at least two clamping transistors, such that the voltage difference between ends of each clamping transistor is at least less than or equal to VDD. The at least two clamping transistors may be connected in series, having a first clamping transistor in the series connect with the first power supply terminal 20 and having a last clamping transistor in the series connect with the second power supply terminal 21. After simultaneously receiving the first discharge control signal and the second discharge control signal, all clamping transistors in the clamping unit 25 may be turned on. The gate signal of each clamping transistor may be input into own gate terminal, based on the valid logic of the first discharge control signal and the second discharge control signal.

In the embodiment when the first power supply terminal 20 connects with the power-supply voltage VDDH, the second power supply terminal 21 connects with the ground VSS and the divided voltage at the voltage-dividing output node 26 is VDD, the electrostatic discharge protection circuit 2 operates as follows.

When an ESD pulse is applied to the first power supply terminal 20, the voltage-dividing output node 26 may sense the electrostatic signal. At this point, the first detection unit 22 may produce and send out the first signal. The second detection unit 23 may produce and send out the second signal. The control unit 24 may be driven by the first signal and the second signal. The first signal may be inverted to produce the first discharge control signal. The second signal may be inverted to produce the second discharge control signal. The clamping unit 25 may receive the first discharge control signal and the second discharge control signal from the control unit 24. Based on the first discharge control signal and the second discharge control signal, the clamping unit 25 may turn on the clamping transistors configured therein and may discharge the electrostatic charges accumulated due to ESD shocks.

When a normal supply voltage VDDH is applied to the first power supply terminal 20, the divided voltage VDD at the voltage-dividing output node 26 may be maintained. Meanwhile, the driving voltage of each of the first detection unit 22, the second detection unit 23, the inverters of the control unit 24, and the clamping transistors in the clamping unit 25, may not exceed the divided voltage VDD. Thus, the voltage handling capacity of the components/devices of the electrostatic discharge protection circuit 2 may be increased.

Figure 3:
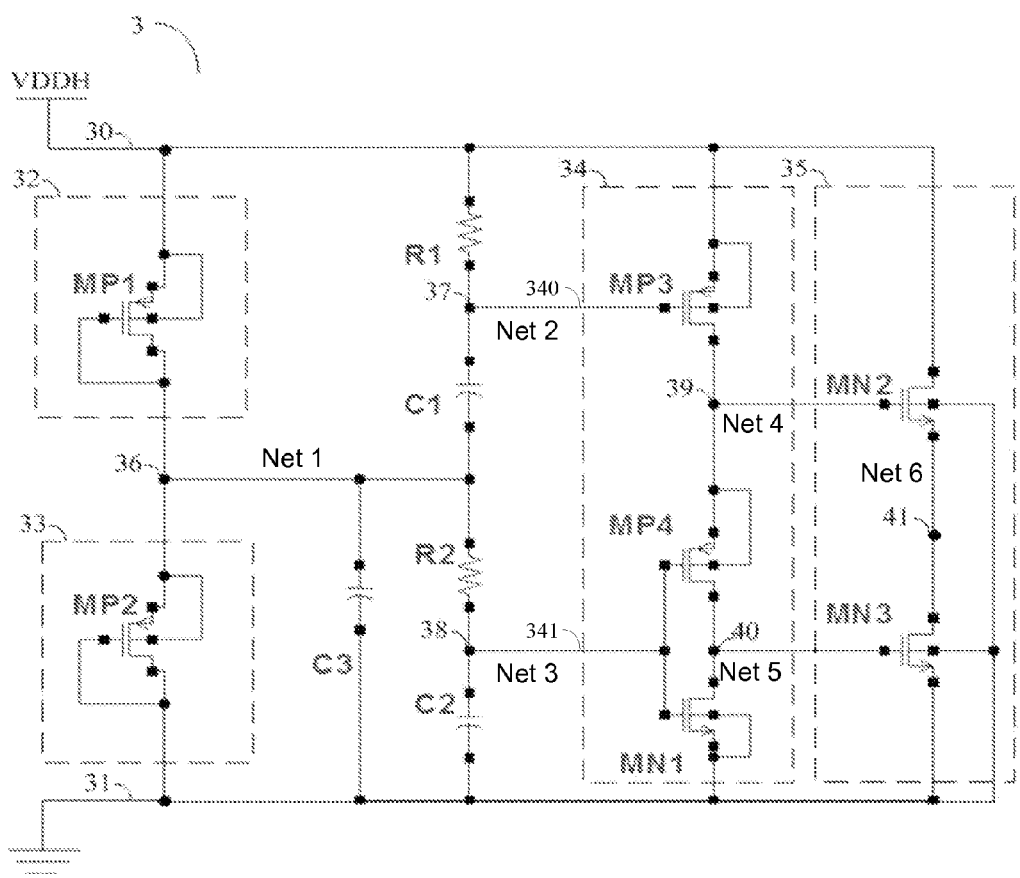
FIG. 3 illustrates a schematic diagram of another exemplary electrostatic discharge protection circuit consistent with various disclosed embodiments.

Based on the electrostatic discharge protection circuit 2, the present disclosure also provides another exemplary electrostatic discharge protection circuit 3 as shown in FIG. 3.

The electrostatic discharge protection circuit 3 in FIG. 3 may include a first power supply terminal 30, a second power supply terminal 31, a first resistor unit 32, a second resistor unit 33, a first detection unit, a second detection unit, a control unit 34, and a clamping unit 35. Between the first power supply terminal 30 and the second power supply terminal 31, there may be the voltage-dividing output node 36. The first resistor unit 32 may be located between the first power supply terminal 30 and the voltage-dividing output node 36. The second resistor unit 33 may be located between the voltage-dividing output node 36 and the second power supply terminal 31.

The first resistor unit 32 may be a first diode. The second resistor unit 33 may be a second diode. The anode of the first diode may connect with the first power supply terminal 30. The cathode of the first diode may connect with the voltage-dividing output node 36. The anode of the second diode may connect with the voltage-dividing output node 36. The cathode of the second diode may connect with the second power supply terminal 31.

Returning to FIG. 3, the first diode may be a diode-connected PMOS transistor MP1. The source of the PMOS transistor MP1 may be the anode of the first diode. The drain of the PMOS transistor MP1 may be the cathode of the first diode. The gate and the drain of the PMOS transistor MP1 may be connected with each other. The PMOS transistor MP1 may be considered as a one-way conduction resistor.

The second diode, as the second resistor unit 33, may be a diode-connected PMOS transistor MP2. The source of the PMOS transistor MP2 may be the anode of the second diode. The drain of the PMOS transistor MP2 may be the cathode of the second diode. The gate and the drain of the PMOS transistor MP2 may be connected with each other. The PMOS transistor MP2 may be considered as a one-way conduction resistor.

In other embodiments, the diodes may be formed by a diode-connected N-type field effect transistor (FET). For example, the first diode may a diode-connected NMOS transistor. The drain of the NMOS transistor may be used as the anode of the first diode. The source of the NMOS transistor may be used as the cathode of the first diode. The gate and the drain of the NMOS transistor may connect with each other.

The structure of the first resistor unit 32 and the second resistor unit 33 may not be limited to as described above. In other embodiments, the first resistor unit 32 may include a plurality of first resistors connected in series. The second resistor unit 33 may include a plurality of second resistors connected in series. The first resistor unit 32 and the second resistor unit 33 may be the diodes described above or other components having equivalent resistance.

Returning to FIG. 3, the first detection unit may include a first input terminal (e.g., also the voltage-dividing output node 36), a first resistor R1, a first capacitor C1, a second capacitor C3, and a first output terminal 37.

The voltage-dividing output node 36 may also be used as the first input terminal. One end of the first resistor R1 may connect with the first power supply terminal 30. The other end of the first resistor R1 may connect with the first output terminal (here the voltage-dividing output node 36). One end of the first capacitor C1 may connect with the voltage-dividing output node 36. The other end of the first capacitor C1 may connect with the first output terminal 37. One end of the second capacitor C3 may connect with the voltage-dividing output node 36. The other end of the second capacitor C3 may connect with the second power supply terminal 31. The first output terminal 37 may be configured to output the first signal.

The second detection unit may include a second input terminal (e.g., also the voltage-dividing output node 36), a second resistor R2, a third capacitor C2 and a second output terminal 38.

As disclosed herein, the voltage-dividing output node 36 may also be used as the second input terminal. One end of the second resistor R2 may connect with the voltage-dividing output node 36. The other end of the second resistor R2 may connect with the second output terminal 38. One end of the third capacitor C2 may connect with the second output terminal 38. The other end of the third capacitor C2 may connect with the second power supply terminal 31. The second output terminal 38 may be configured to output the second signal.

Both the first detection unit and the second detection unit may be used to detect an electrostatic signal between the first power supply terminal 30 and the second power supply terminal 31, and may also be used to improve voltage tolerance.

For example, the first detection unit may detect a first electrostatic signal between the first power supply terminal 30 and the voltage-dividing output node 36. The second detection unit may detect a second electrostatic signal between the voltage-dividing output node 36 and the second power supply terminal 31. The first electrostatic signal and the second electrostatic signal may be determined by the electrostatic signal between the first power supply terminal 30 and the second power supply terminal 31. The first electrostatic signal and the second electrostatic signal may be generated by dividing the electrostatic signal between the first power supply terminal 30 and the second power supply terminal 31.

When an electrostatic pulse is generated between the first power supply terminal 30 and the second power supply terminal 31, a voltage-dividing electrostatic pulse is certainly generated between the first power supply terminal 30 and the voltage-dividing output node 36. Another voltage-dividing electrostatic pulse may also be generated between the voltage-dividing output node 36 and the second power supply terminal 31. Ends of each of the first capacitor C1 and the second capacitor C3 may form a conductive path. Ends of the third capacitor C2 may also form a conductive path. The first capacitor C1, the second capacitor C3, and the third capacitor C2 may be considered as three small resistors. The first signal and the second signal may respectively correspond to a grounded signal or a low voltage level signal.

When no electrostatic pulse is generated between the first power supply terminal 30 and the second power supply terminal 31, no voltage-dividing electrostatic pulse may be generated between the first power supply terminal 30 and the voltage-dividing output node 36. No voltage-dividing electrostatic pulse may be generated between the voltage-dividing output node 36 and the second power supply terminal 31 either. Each of the first capacitor C1, the second capacitor C3 and the third capacitor C2 may be equivalent to an open circuit. The first capacitor C1, the second capacitor C3 and the third capacitor C2 may be considered as three resistors with limitless resistance. The signal outputted at the first output terminal 37 may be equivalent to the power supply voltage VDDH. The signal outputted at the second output terminal 38 may be equivalent to the voltage-dividing signal VDD or a high voltage level signal.

The first detection unit and the second detection unit may be coordinated and may respectively implement voltage-dividing electrostatic signal detection and the discharge time control. Because of consistency between the detection and the discharge, the RC time constant of the first detection unit may correspond to the RC time constant of the second detection unit.

Returning to FIG. 3, the control unit 34 may include a first control terminal 340, a second control terminal 39, a third control terminal 342, a fourth control terminal 40, a first P-type field effect transistor MP3, a second P-type field effect transistor MP4, and a first N-type field effect transistor MN1.

The first control terminal 340 may connect with the first output terminal 37. The source of the first P-type field effect transistor MP3 may connect with the first power supply terminal 30. The drain of the first P-type field effect transistor MP3 may connect with the second control terminal 39. The gate of the first P-type field effect transistor MP3 may connect with the first control terminal 340. The second control terminal 39 may be configured to produce/output a first discharge control signal.

The third control terminal 341 may connect with the second output terminal 38. The source of the second P-type field effect transistor MP4 may connect with the second control terminal 39. The drain of the second P-type field effect transistor MP4 may connect with the fourth control terminal 40. The gate of the second P-type field effect transistor MP4 may connect with the third control terminal 342. The fourth control terminal 40 may be configured to produce/output the second discharge control signal.

The source of the first N-type field effect transistor MN1 may connect with the second power supply terminal 31. The drain of the first N-type field effect transistor MN1 may connect with the fourth control terminal 40. The gate of the first N-type field effect transistor MN1 may connect with the third control terminal 341.

In the control unit 34, the first discharge control signal may be a high voltage level at the second control terminal 39 when the first P-type field effect transistor MP3 is controlled to be turned on by the first signal. The first discharge control signal may be equivalent to the power supply voltage signal. Similarly, the second discharge control signal may be a high voltage level at the fourth control terminal 40 when the second P-type field effect transistor MP4 is controlled to be turned on by the second signal. The second discharge control signal may be equivalent to the power supply voltage.

Further, the gate of the first P-type field effect transistor MP3 may have the equivalent capacitance of the transistor, which may affect the discharge speed of the gate voltage level. When detecting the electrostatic signal, the first P-type field effect transistor MP3 may be turned on with significant delay and the electrostatic discharge may not be timely performed. To solve this problem, the present disclosure may set the capacitance of the second capacitor C3 as shown in FIG. 3 as a large value, which is larger than the equivalent capacitance at the gate of the first P-type field effect transistor MP3.

In other embodiments, the control unit 34 may use another exemplary structure including a first inverter and a second inverter.

The input terminal of the first inverter may connect with the first signal. The output terminal of the first inverter may output an inverted first signal, i.e., the first discharge control signal. The input terminal of the second inverter may connect with the second signal. The output terminal of the second inverter may output an inverted second signal, i.e., a second discharge control signal.

Further, the structure of the clamping unit 35 may be defined as follows. The clamping unit 35 may include a second N-type field effect transistor MN2 and a third N-type field effect transistor MN3.

The drain of the second N-type field effect transistor MN2 may connect with the first power supply terminal 30. The gate of the second N-type field effect transistor MN2 may connect with the second control terminal 39 to obtain the first discharge control signal. The drain of the third N-type field effect transistor MN3 may connect with the source of the second N-type field effect transistor MN2. The source of the third N-type field effect transistor MN3 may connect with the second power supply terminal 31. The gate of the third N-type field effect transistor MN3 may connect with the fourth control terminal 40 to obtain the second discharge control signal.

The second N-type field effect transistor MN2 may be turned on after receiving the first discharge control signal (high voltage level). The third N-type field effect transistor MN3 may be turned on after receiving the second discharge control signal (high voltage level). When both the second N-type field effect transistor MN2 and the third N-type field effect transistor MN3 are turned on simultaneously, the discharge of electrostatic current between the first power supply terminal 30 and the second power supply terminal 31 may be completed.

It should be noted that, under normal operation mode where the power supply voltage VDDH is applied to the first power supply terminal 30 and the second power supply terminal 31 is grounded, the voltage-dividing detection structure of the electrostatic discharge protection circuit 3 may allow that the voltages between both ends of each of the capacitors, resistors, and the transistors are approximately at the VDD and may increase the voltage handling capacity (or tolerance) of the components when subject to a high power supply voltage.

In various embodiments, the above described power supply voltage loading may be further extended. For example, the electrostatic discharge protection circuit 3 may include a first power supply and a second power supply. The first power supply may be used to provide a first power supply voltage to the first power supply terminal 30. The second power supply may be used to provide a second power supply voltage to the second power supply terminal 31. The voltage difference between the first power supply voltage and the second power supply voltage may be greater than the voltage difference between ends of each of any other components (other than the first power supply and the second power supply).

Referring back to FIG. 3, the first power supply terminal 30 may connect with the power supply voltage VDDH. The second power supply terminal 31 may be grounded. The divided voltage at the voltage-dividing output node 36 may be one half (½) of the power supply voltage VDDH. The electrostatic discharge protection circuit 3 operates as follows.

When an electrostatic pulse is applied to the first power supply terminal 30, the voltage at the first output terminal 37 may be pulled down to the voltage level of the second power supply terminal 31 (e.g., zero voltage). The first output terminal 37 may output a first signal. Meanwhile, the first detection unit may detect an electrostatic signal between the first power supply terminal 30 and the voltage-dividing output node 36.

The voltage at the second output terminal 38 may be pulled down to the voltage level of the second power supply terminal 31 (zero voltage). The second output terminal 38 may output a second signal. Meanwhile, the second detection unit may detect an electrostatic signal between the second power supply terminal 31 and the voltage-dividing output node 36.

After the control unit 34 receives the first signal and the second signal, the first P-type field effect transistor MP3 and the second P-type field effect transistor MP4 may be turned on to invert the first signal and the second signal to produce/output the first discharge control signal and the second discharge control signal respectively.

The second N-type field effect transistor MN2 and the third N-type field effect transistor MN3 may be clamping transistors. The gate voltage of the second N-type field effect transistor MN2 may be pulled up to a high voltage level by the first discharge control signal. The gate voltage of the third N-type field effect transistor MN3 may be pulled up to a high voltage level by the second discharge control signal. Then, when both the second N-type field effect transistor MN2 and the third N-type field effect transistor MN3 are turned on simultaneously, electrostatic charges accumulated between the first power supply terminal 30 and the second power supply terminal 31 may be discharged.

After a time period of the RC time constant for coupling the resistor R1 and the capacitor C1 (and/or the capacitor C3) passes, the voltage of the first output terminal 37 may change to the voltage level (e.g., high voltage level) of the first power terminal 30. After a time period of the RC time constant for coupling the resistor R2 and the capacitor C2 passes, the voltage at the output terminal 38 may change to the voltage level (e.g., high voltage level) of the second power supply terminal 31. Meanwhile, the gate voltages of the second N-type field effect transistor MN2 and the third N-type field effect transistor MN3 may be pulled down to a low voltage level. Such ESD protection process may be performed by the electrostatic discharge protection circuit 3.

When the normal supply power is applied to the first power supply terminal 30, the voltage at the first output terminal 37 may remain at the power supply voltage (VDDH). The voltage of the second output terminal 38 may remain at the one half (½) of the power supply voltage (VDD). At this point, the first output terminal 37 and the second output terminal 38 may produce high voltage level outputs. The high voltage level outputs may be inverted by the control unit 34. The gate voltage of the second N-type field effect transistor MN2 may be at the VDD. The gate voltage of the third N-type field effect transistor MN3 may be at the low voltage level, which ensures that the clamping unit 35 does not leak any current in the normal power on process.

In this manner, the disclosed circuit may be a clamp circuit including four exemplary functional elements: a voltage divider (including e.g., first resistor unit 27 and second resistor unit 28 in FIG. 2 or first resistor unit 32 and second resistor unit 33 in FIG. 3), a trigger circuit [including e.g., first detection unit 22 and second detection unit 23 in FIG. 2, or first detection unit (including first input terminal (36), first resistor R1, first capacitor C1, second capacitor C3, and first output terminal 37) and second detection unit (including second input terminal (36), second resistor R2, third capacitor C2, and second output terminal 38) in FIG. 3], pre-driver stage (including e.g., control unit 24 in FIG. 2 or control unit 34 in FIG. 3), and two large stack-NMOSFET (including e.g., clamping unit 25 in FIG. 2 and clamping unit 35 in FIG. 3). All these elements are 1×VDD voltage tolerance devices. The two power supply rail (e.g., including first power supply terminal 20 and second power supply terminal 21 in FIG. 2 or first power supply terminal 30 and second power supply terminal 31 in FIG. 3) is VDDH and VSS, where VDDH is two times voltage of internal power supply voltage (2×VDD).

As shown in FIG. 3, the voltage divider is designed to generate lower and reliable potential (see voltage-dividing output node 36, net1) from 2×VDD power supply voltage by MP1 and MP2, with small leakage. Trigger circuit (e.g., R1, C1, R2, C2 and C3) utilizes resistor and capacitor to detect ESD event and normal IC operation state, and also provide a RC time constant for ESD discharge duration. Pre-driver stage may pull up the gate voltage of the two big stack-NMOS to VDDH power rail voltage (MP3, MP4 and MN1). The big stack-NMOSFET may connect two power supply rails, and may be activated as a low resistance conductive state in response to an ESD event and discharge large current from VDDH power rail to VSS ground rail.

At an ESD event, a rapid positive voltage transient is induced on the VDDH rail. Capacitor C1, C2 and C3 may act as a low resistance at the ESD voltage ramp-up time. Net2 and net3 are initially pulled to low level. MP3 and MP4 have a gate connected to net2 and net 3, separately, and are turned on while MN1 is turned off. Then the gate terminals of stack-NMOSFET MN2 and MN3, net4 and net5 respectively, are both driven to VDDH rail voltage rapidly by MP3 and MP4. MN2 and MN3 are turned on and large current discharge may occur from VDDH power supply rail to VSS rail. The RC time constant maintain the discharge for a period of time during ESD stress event. This clamp circuit clamps the power rail voltage to voltage under breakdown voltage off VDD voltage tolerate device and protects internal circuits.

Since the parasitic capacitance of net2, generated from gate of MP3, may pull up net2 (which is the gate terminal of MP3) to high potential at the ESD voltage ramp on time, the turn-on time of MP3 may be delayed. This may impact the discharge response time. To solve this problem, capacitor C3 is designed to balance the effect of the parasitic capacitor. C3 is connected between net3 and ground VSS. And its capacitance value is larger than Cg of MP3. At the ESD voltage ramp on time, C3 may pull net3 to lower the potential. And the MP3 turn-on time and discharge response may be speeded up.

During normal IC operation, 2×VDD voltage is between VDDH rail and VSS rail. The voltage level of net1 is biased to 1×VDD voltage by the voltage divider circuit. Since the power supply rail ramp on time is much slower than ESD transient, capacitors C1, C2 and C3 may act as having very large impedance. Net2 and net3 are pulled to the voltage level of VDDH rail voltage and net1 voltage respectively by the resistor R1 and R2. So voltage of net2 and net3 are 2×VDD voltage and 1×VDD voltage. MN1 may be turned on in low resistor state and may pull down the voltage of net5 to nearly 0V. Therefore, MN3 is turned off and there is no leakage current in the stack NMOS. MP3 is totally turned off since the gate-source potential is nearly 0V. Therefore there's no trigger current generated from the pre-driver stage. At the same time, MP4 is turned off and net4 voltage is pulled down to around net3 voltage to keep very low leakage. Net6 voltage is around the gate voltage of MN2 to keep very low leakage. In this situation, all the devices are free from gate-oxide reliability issue under normal IC operating condition with power supply rail of 2×VDD voltage.

As such, in one embodiment, an NMOS clamp circuit may be provided with two times power supply for ESD protection for internal devices during an ESD event. Stack-NMOSFET may provide large current discharge path from power rail to ground during a positive ESD event. The NMOS clamp circuit may also include a voltage divider, an RC detect circuit, and a pre-driver stage. The voltage divider circuit may generate a lower reliable voltage from high power supply voltage. The RC detect circuit may include two groups of R/C net to detect the ESD event and normal operating state. A capacitor may be used for speeding up the ESD protection response by balancing the parasitical capacitor. The pre-driver stage may include two stack PMOS to pull up both gates of big stack-NMOS to power rail voltage for the discharge efficiency at ESD event, and suffer no gate-oxide stress during normal operating state.

Although the present invention is disclosed above with various embodiments, the present invention is not limited thereto. Anyone skilled in the art may make various changes and modifications without departing from the spirit and scope of the present invention. Therefore the scope of the present invention should be defined by the claims thereof.

What is claimed is:

1. An electrostatic discharge (ESD) protection circuit, comprising:
   a first power supply terminal, a second power supply terminal, a first detection unit, a second detection unit, a control unit, a clamping unit, and a voltage-dividing output node defined between the first and the second power supply terminals, wherein:
   the first detection unit is configured to detect an electrostatic signal, based on a signal between the first power supply terminal and the voltage-dividing output node, and to output a first signal when the electrostatic signal is sensed, wherein the first detection unit comprises a first input terminal, a first resistor, a first capacitor, a second capacitor, and a first output terminal;
   the first input terminal is configured to connect with the voltage-dividing output node;
   the first resistor has one end connecting with the first power supply terminal and has another end connecting with the first output terminal;
   the first capacitor has one end connecting with the first input terminal and has another end connecting with the first output terminal;
   the second capacitor has one end connecting with the first input terminal and has another end connecting with the second power supply terminal, the second capacitor is connected to the second detection unit in parallel; and
   the first output terminal is configured to output the first signal;
   the second detection unit is configured to detect an electrostatic signal, based on a signal between the second power supply terminal and the voltage-dividing output node, and to output a second signal when the electrostatic signal is sensed;
   the control unit is configured to be driven by the first signal to convert the first signal into a first discharge control signal and by the second signal to convert the second signal into a second discharge control signal; and
   the clamping unit is configured to receive the first discharge control signal and the second discharge control signal to discharge an electrostatic current between the first and the second power supply terminals.

2. The circuit of claim 1, further including:
a first resistor unit and a second resistor unit, wherein:
the first resistor unit is located between the first power supply terminal and the voltage-dividing output node, and
the second resistor unit is located between the second power supply terminal and the voltage-dividing output node.

3. The circuit of claim 2, wherein:
the first resistor unit is a first diode and the second resistor unit is a second diode;
the first diode has an anode connecting with the first power supply terminal and has a cathode connected with the voltage-dividing output node; and
the second diode has an anode connecting with the voltage-dividing output node and has a cathode connected with the second power supply terminal.

4. The circuit of claim 3, wherein each of the first and second diodes includes a diode-connected P-type field effect transistor or a diode-connected N-type field effect transistor.

5. The circuit of claim 2, wherein:
the first resistor unit includes a plurality of first resistors connected in series, and
the second resistor unit includes a plurality of second resistors connected in series.

6. The circuit of claim 1, wherein:
the second detection unit includes a second input terminal, a second resistor, a third capacitor, and a second output terminal;
the second input terminal is configured to connect with the voltage-dividing output node;
the second resistor has one end connecting with the second input terminal and has another end connecting with the second output terminal;
the third capacitor has one end connecting with the second output terminal and has another end connecting with the second power supply terminal; and
the second output terminal is configured to output the second signal.

7. The circuit of claim 1, wherein:
the first detection unit has an RC time constant corresponding to an RC time constant of the second detection unit.

8. The circuit of claim 1, wherein:
the control unit includes a first control terminal, a second control terminal, and a first P-type field effect transistor;
the first control terminal is configured to connect with the first output terminal;
the first P-type field effect transistor has a source connecting with the first power supply terminal, has a drain connecting with the second control terminal, and has a gate connecting with the first control terminal; and
the second control terminal is configured to output the first discharge control signal.

9. The circuit of claim 6, wherein:
the control unit includes a third control terminal, a fourth control terminal, a second P-type field effect transistor, and a first N-type field effect transistor;
the third control terminal is configured to connect with the second output terminal;
the second P-type field effect transistor has a source connecting with the second control terminal, has a drain connecting with the fourth control terminal, and has a gate connecting with the third control terminal;
the fourth control terminal is configured to output the second discharge control signal; and
the first N-type field effect transistor has a source connecting with the second power supply terminal, has a drain connecting with the fourth control terminal, and has a gate connecting with the third control terminal.

10. The circuit of claim 8, wherein:
the second capacitor has a capacitance greater than an equivalent capacitance of the gate of the first P-type field effect transistor.

11. The circuit of claim 1, wherein:
the clamping unit includes a second N-type field effect transistor and a third N-type field effect transistor;
the second N-type field effect transistor has a drain connecting with the first power supply terminal, and has a gate connecting with the first discharge control signal; and
the third N-type field effect transistor has a drain connecting with a source of the second N-type field effect transistor, has a source connecting with the second power supply terminal, and has a gate connecting with the second discharge control signal.

12. The circuit of claim 11, wherein:
the control unit includes a first inverter and a second inverter;
the first inverter has an input terminal connecting with the first signal and has an output terminal connecting with the gate of the second N-type field effect transistor; and
the second inverter has an input terminal connecting with the second signal and has an output terminal connecting with the gate of the third N-type field effect transistor.

13. The circuit of claim 1, further including:
a first power supply configured to supply a first power supply voltage to the first power supply terminal; and
a second power supply configured to supply a second power supply voltage to the second power supply terminal, wherein a voltage difference between the first power supply and the second power supply is greater than a voltage difference between two terminals of any component in the ESD protection circuit.

14. A method for configuring an electrostatic discharge (ESD) protection circuit, comprising:
providing a first power supply terminal, a second power supply terminal, a first detection unit, a second detection unit, a control unit, and a clamping unit suitable for a circuit;
defining a voltage-dividing output node between the first and the second power supply terminals;
configuring the first detection unit to detect an electrostatic signal, based on a signal between the first power supply terminal and the voltage-dividing output node, and to output a first signal when the electrostatic signal is sensed, wherein the first detection unit includes a first input terminal, a first resistor, a first capacitor, a second capacitor, and a first output terminal;
the first input terminal is configured to connect with the voltage-dividing output node;
the first resistor has one end connecting with the first power supply terminal and has another end connecting with the first output terminal;
the first capacitor has one end connecting with the first input terminal and has another end connecting with the first output terminal;
the second capacitor has one end connecting with the first input terminal and has another end connecting with the second power supply terminal, the second capacitor is connected to the second detection unit in parallel; and the first output terminal is configured to output the first signal;

configuring the second detection unit to detect an electrostatic signal, based on a signal between the second power supply terminal and the voltage-dividing output node, and to output a second signal when the electrostatic signal is sensed;

configuring the control unit to be driven by the first signal to convert the first signal into a first discharge control signal and by the second signal to convert the second signal into a second discharge control signal; and configuring the clamping unit to receive the first discharge control signal and the second discharge control signal to discharge an electrostatic current between the first and the second power supply terminals.

15. The method of claim 14, further including:

configuring a first resistor unit between the first power supply terminal and the voltage-dividing output node, and configuring a second resistor unit between the second power supply terminal and the voltage-dividing output node, wherein:

the first resistor unit is a first diode and the second resistor unit is a second diode, the first diode has an anode connecting with the first power supply terminal and has a cathode connected with the voltage-dividing output node, and the second diode has an anode connecting with the voltage-dividing output node and has a cathode connected with the second power supply terminal.

16. The method of claim 14, wherein:

the control unit includes a first control terminal, a second control terminal, and a first P-type field effect transistor;

the first control terminal is configured to connect with the first output terminal;

the first P-type field effect transistor has a source connecting with the first power supply terminal, has a drain connecting with the second control terminal, and has a gate connecting with the first control terminal; and the second control terminal is configured to output the first discharge control signal.

17. The method of claim 14, wherein:

the clamping unit includes a second N-type field effect transistor and a third N-type field effect transistor;

the second N-type field effect transistor has a drain connecting with the first power supply terminal, and has a gate connecting with the first discharge control signal; and the third N-type field effect transistor has a drain connecting with a source of the second N-type field effect transistor, has a source connecting with the second power supply terminal, and has a gate connecting with the second discharge control signal.

18. The method of claim 14, further including:

configuring a first power supply to supply a first power supply voltage to the first power supply terminal; and configuring a second power supply to supply a second power supply voltage to the second power supply terminal, wherein a voltage difference between the first power supply and the second power supply is greater than a voltage difference between two terminals of any component in the ESD protection circuit.

* * * * *